United States Patent
Krassnitzer et al.

(10) Patent No.: US 9,376,745 B2
(45) Date of Patent: Jun. 28, 2016

(54) HIGH-POWER SPUTTERING SOURCE

(75) Inventors: Siegfried Krassnitzer, Feldkirch (AT); Kurt Ruhm, Schaanwald (LI)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 86 days.

(21) Appl. No.: 14/112,618

(22) PCT Filed: Mar. 30, 2012

(86) PCT No.: PCT/EP2012/001414
§ 371 (c)(1),
(2), (4) Date: Nov. 18, 2013

(87) PCT Pub. No.: WO2012/143087
PCT Pub. Date: Oct. 26, 2012

(65) Prior Publication Data
US 2014/0061030 A1 Mar. 6, 2014

(30) Foreign Application Priority Data
Apr. 20, 2011 (DE) .......................... 10 2011 018 363

(51) Int. Cl.
C23C 14/34 (2006.01)
C23C 14/35 (2006.01)
H01J 37/34 (2006.01)

(52) U.S. Cl.
CPC ............... *C23C 14/35* (2013.01); *C23C 14/352* (2013.01); *H01J 37/3405* (2013.01); *H01J 37/3444* (2013.01); *H01J 37/3464* (2013.01); *H01J 37/3467* (2013.01); *H01J 37/3497* (2013.01)

(58) Field of Classification Search
CPC C23C 14/352; H01J 37/3405; H01J 37/3452; H01J 37/3467
USPC .......................... 204/298.08, 192.12
See application file for complete search history.

(56) References Cited

U.S. PATENT DOCUMENTS 6,063,245 A * 5/2000 Frach et al. .............. 204/192.15
6,183,614 B1 2/2001 Fu
(Continued)

FOREIGN PATENT DOCUMENTS

DE 10 2006 017 382 A1 5/2007
DE 10 2008 021 912 A1 11/2009
(Continued)

OTHER PUBLICATIONS

Ehiasarian et al., "Influence of High Power Densities on the Composition of Pulsed Magnetron Plasmas" Vacuum, Pergamon Press, GB vol. 65, No. 2, Apr. 19, 2002, pp. 147-154.
(Continued)

*Primary Examiner* — Rodney McDonald
(74) *Attorney, Agent, or Firm* — Pearne & Gordon LLP

(57) ABSTRACT

The invention relates to a magnetron sputtering process that allows material to be sputtered from a target surface in such a way that a high percentage of the sputtered material is provided in the form of ions. According to the invention, said aim is achieved using a simple generator, the power of which is fed to multiple magnetron sputtering sources spread out over several time intervals, i.e. the maximum power is supplied to one sputtering source during one time interval, and the maximum power is supplied to the following sputtering source in the subsequent time interval, such that discharge current densities of more than 0.2 A/cm² are obtained. The sputtering target can cool down during the off time, thus preventing the temperature limit from being exceeded.

8 Claims, 3 Drawing Sheets

(56) References Cited

U.S. PATENT DOCUMENTS

| | | |
|---|---|---|
| 6,413,382 B1 | 7/2002 | Wang et al. |
| 2007/0034498 A1* | 2/2007 | Ganciu-Petcu et al. ... 204/192.1 |
| 2007/0131536 A1* | 6/2007 | Hartig et al. ............... 204/192.1 |

FOREIGN PATENT DOCUMENTS

| | | |
|---|---|---|
| DE | 20 2010 001 497 U1 | 4/2010 |
| WO | 03/006703 A1 | 1/2003 |
| WO | 2007/054048 A1 | 5/2007 |
| WO | 2012/089286 A1 | 7/2012 |

OTHER PUBLICATIONS

Broitman, et al., "Industrial-scale deposition of highly adherent CNx films on steel substrates" Surface and Coatings Technology, vol. 204 No. 21-22, Aug. 1, 2010, pp. 3349-3357.

International Search Report for PCT/EP2012/001414 dated Oct. 2, 2012.

* cited by examiner

HIGH-POWER SPUTTERING SOURCE

The invention relates to a method for coating substrates by means of magnetron sputtering.

In the frame of this description, "sputter" is used with the same meaning as "spray coating".

During sputtering, a target (cathode) is bombarded with ions, which results in the material being removed from the target. The acceleration of the ions in the direction of the target surface from plasma is achieved by means of an electric field. During magnetron sputtering, a magnetic field is formed over the target surface. In this manner, electrons in the plasma are forced onto a spiral path and circulate over the target surface. Due to their extended journey, the number of collisions of electrons with atoms resp. ions is considerably increased, which leads to a higher ionization in this area over the target surface. This results in an increased sputtering removal on the target immediately under the area. This leads to the erosion tracks with overlying racetrack typical for magnetron sputtering. Such an erosion track has the disadvantage that large areas of the target are essentially not removed. Target material is however often an expensive material. Occasionally, the magnet system generating the magnetic field is designed behind the target in such a manner that this results in a kidney-shaped racetrack, as represented in FIG. 1. In the case of a round cathode, the magnet system is rotated around the central axis of the round cathode so that it results essentially in a uniform removal of the target material. The disadvantage of conventional sputtering however remains that the removed material is ionized only to a very low degree.

The present invention relates in particular to a HIPIMS process (High Power Impulse Magnetron Sputtering). HIPIMS is a process that evolved from conventional sputtering and that uses the effect of pulse-like discharges with an impulse duration in the range of microseconds to milliseconds with power densities greater than 100 W/cm$^2$. The emerging HIPIMS technology eliminates the great disadvantage of conventional sputtering, namely the very low ionization of the sputtered atoms. The state of the art has thus shown that, depending on the material, HIPIMS technology could achieve a ionization of up to 100% of the sputtered particles. In this respect, the at least momentarily high discharge current density that acts on the target gives rise to the increased degree of ionization. The increased degree of ionization can modify the growth mechanism of the layers and thus has an influence on the layer properties. This results inter alia to an increased adhesive strength.

Average power densities typically used are in the range of 20 W/cm$^2$, both in conventional sputtering as well as in HIPIMS. With high loads, this can rise up to 50 W/cm$^2$ when using particular target cooling devices. The corresponding discharge current densities in this case are in the range up to 0.2 A/cm$^2$. From the point of view of plasma physics and electronics, considerably higher power densities and thus discharge current densities would however be no problem. However, the average power that can be used on a sputtering target is essentially limited in that the target cooling is subject to technical limitations. For this reason, in the HIPIMS process the sputtering power is applied in pulsed form, wherein the impulse duration is chosen to be so short that due to the average power acting on the target no excess temperature will occur. It is obvious in this connection that the target temperature and the maximum allowed target temperature will depend very much on the target material and on its heat conductivity and its mechanical properties.

The disadvantage is that impulse technology involves considerably complex equipment, since generators need to be used that are capable of distributing the power in time and space in sputtering power impulses. Conventional generator technology does not allow this to be achieved.

In order to overcome this disadvantage, it is proposed in the state of the art to switch to a racetrack that is considerably downscaled as compared with the overall size of the target and to have this racetrack wander over the target surface. For example, U.S. Pat. No. 6,413,382 by Wang et al. proposes a magnet system that leads to a magnetron covering less than 20% of the target surface. The magnet system is mounted in a rotating fashion behind the target surface so that the racetrack can essentially coat the entire target surface. This approach will indeed simplify the generators, however it is still not possible to completely do without impulse technology. Accordingly, an impulse/pause ratio of less than 10% is indicated.

However, the disadvantage in so doing is that the apparatus designed accordingly will be suitable exclusively for HIPIMS applications. Due to the strongly reduced racetrack size, the sputtering rate is correspondingly low. If it is necessary to alternate between HIPIMS layers and conventional sputter layers, the corresponding convention sputtering rate is also reduced for these layers.

Nyberg et al. propose in WO03006703A1 a similar approach. They describe that an increased discharge current density is reached by means of a reduced sputtering area. In order to compensate the higher local heat build-up, the sputtering area is moved. Nyberg et al. furthermore describe that For an industrial application, the reduced sputtering area needs to be moved on the target at high speed in order to prevent the surface from melting. This technic enables any conventional generator to be used. Dividing a target in several parts that are separated electrically from one another is seen as a possibility. Hereinafter, these parts are called partial targets. A partial target in this connection should be a completely independent target that is insulated from the other partial targets especially in relation to the power feed, wherein the surfaces of several identical partial targets add up to the total target surface. By concentrating at one point in time the entire power onto one of these partial targets, it is thus possible to control the location from which sputtering currently occurs. By switching the parts on and off, it is possible to make do without any movable components.

One disadvantage of the arrangement by Nyberg et al. is the fact that such a construction cannot be operated in the conventional magnetron sputtering mode, since it is not possible or it is technically very complex to distribute the power of the single generator uniformly on the different parts. The approach of Nyberg et al. also has in particular the disadvantage that it leads on each of the individually controllable partial targets to a steady erosion track. This means that the target utilization is considerably worse by comparison with the rotating magnetron described by Wang et al.

It would therefore be desirable to have an apparatus that allows a HIPIMS process to be performed without complex impulse generator technology and which however could be switched over to a conventional sputtering mode in a simple manner.

According to the invention, this aim is achieved in that a target is subdivided into several independent partial targets that are electrically insulated and which are powered by means of a power supply unit that, in the HIPIMS mode, is configured as a master-slave unit. Master-slave configuration is to be understood as the parallel combination of the outputs of two or more generators, wherein the power setting is selected at one of the generators (the master) and the other generators are connected electronically in such a way that the follow the master in their settings. Preferably, as many generators are interconnected in the master-slave configuration as there are individual electrically insulated partial targets. On the individual partial targets, the power is transmitted in the HIPIMS mode only for as long as their cooling will allow. In the HIPIMS mode, the partial targets are switched on and off in succession. The power supply unit in a master-slave configuration therefore never needs to operate at full power simultaneously for all partial targets. In this manner, a cost-effective generator can be used. If conventional sputtering is required, the master-slave configuration is broken up and an own generator is available to each partial target. A partial target can then be operated with a generator as an independent sputtering source. If after breaking up of the master-slave configuration not as many generators are available as there are partial targets, some partial targets can remain durably switched off or it is possible to alternate the switching. In this manner, switching from the HIPIMS mode into the conventional sputtering mode can easily be achieved.

Preferably, behind each partial target there is a movable magnet system that ensures that the respective racetrack wanders over the respective partial target. If the facility is operated in the HIPIMS mode, according to the invention rotating magnet system preferably rotate behind the partial targets with a frequency that preferably forms no rational ratio with the frequency of the recurring power impulse of the sputtering source. This ensures that material is removed uniformly from the target surface.

The invention will now be described in detail and on the basis of the figures by way of example.

Figure 2:
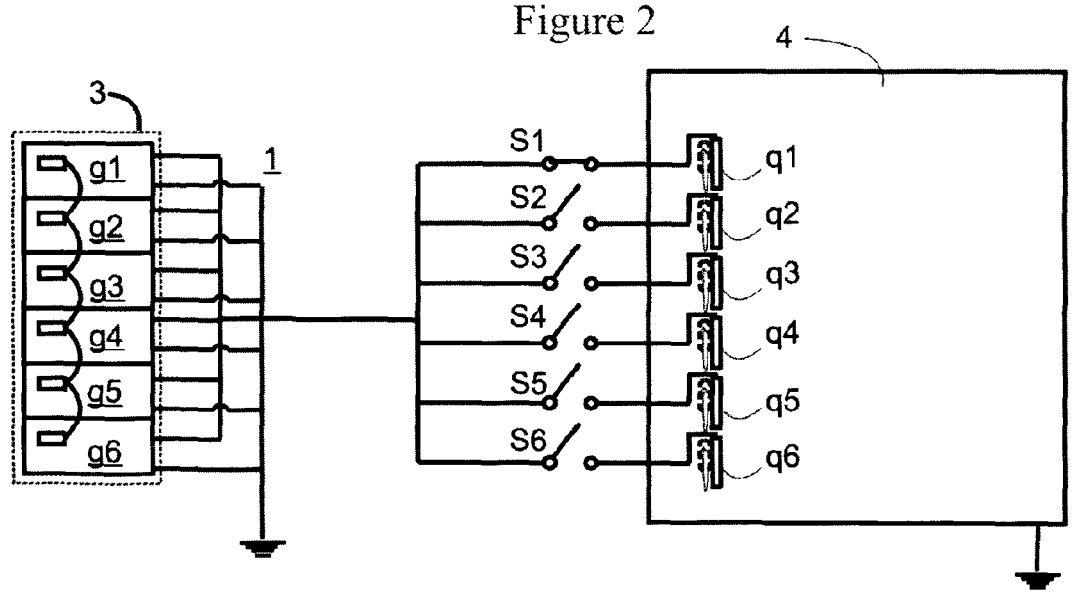
FIG. 2 shows a first embodiment of the present invention with electrically insulated partial targets that each has a moving magnet system, wherein the power supply unit consists of several generators that are connected in a master-slave configuration.

According to a first embodiment of the present invention, as shown diagrammatically in FIG. 2, a power supply unit 3 delivers by means of the switch S1 a voltage and a current to the sputtering source q1 placed in a vacuum chamber 4 for operating the sputtering device in HIPIMS mode. The power supply unit 3 is formed of several generators g1 to g6 that are connected in a master-slave configuration. It can be a DC generator configured as pulsed DC generator. The sputtering source q1 is designed as a magnetron sputtering source with partial target, wherein according to a preferred variant of this embodiment, a movable magnet system ms1 that is preferably mounted in rotation is provided behind the partial target of the sputtering source q1. During use, the racetrack is moved over nearly the entire surface of the target of the sputtering source q1 by moving, preferably rotating, the magnet system ms1.

In the vacuum chamber 4, noble gas and/or reactive gas such as e.g. $N_2$, $O_2$, $C_2H_4$, $C_2H_2$ is admitted, among others in order to be able to maintain the plasma for the sputter discharge. The power supply unit 3 delivers a sputtering power that, if applied without interruption to q1 would exceed the thermal limit of the sputtering source q1. The sputtering power is however suitable for generating a magnetron discharge during which the current density relative to the racetrack surface of the magnetron is greater than 0.2 A/cm$^2$.

Via the switches S2 to S6, voltage and current can be applied to the sputtering sources q2 to q6 that are also arranged in the vacuum chamber 4. These sputtering sources essentially have the same construction as the sputtering source q1.

Overall, the average power on an individual sputtering source may not exceed the value given by the thermal limit. In order to achieve this, after a certain amount of time one sputtering source is switched off and the next one switched on in succession, which results in impulse sequences. Once all sputtering sources have been in operation, the first sputtering source can again be switched on and the cycle can begin anew, which leads to a periodic operation. Any impulse sequences are possible that enable the maximal average power on the target to be maintained.

The magnet systems that move, preferably rotate, behind the sputtering sources move with a frequency that preferably forms no rational ratio with the frequency of the recurring power impulse applied to a sputtering source, which ensures that material is removed uniformly from the target surface.

Figure 3:
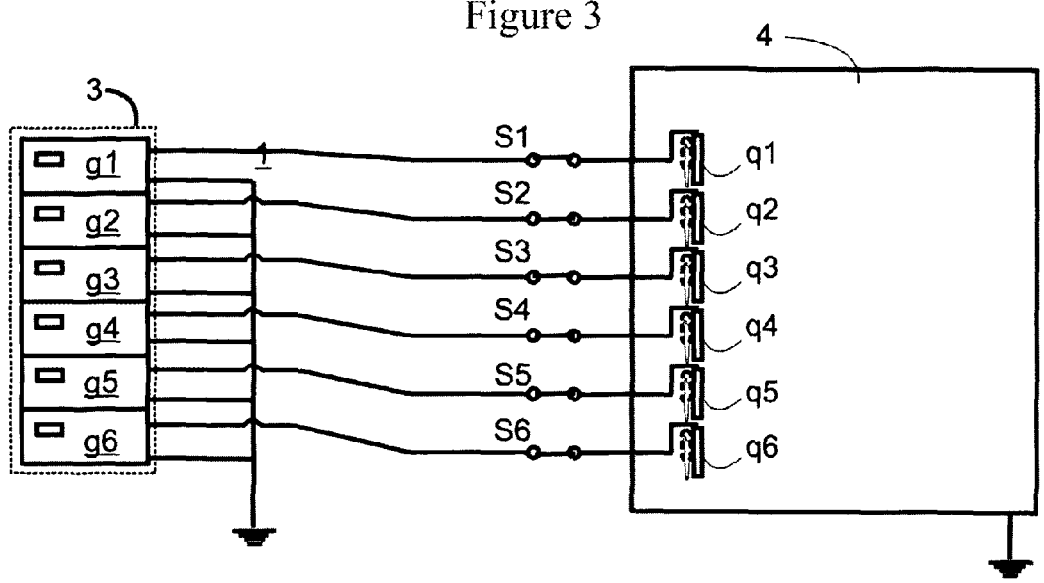
FIG. 3 shows a first embodiment of the present invention with electrically insulated partial targets that each has a moving magnet system, wherein the power supply unit consists of several generators that are not connected in a master-slave configuration so that each partial target is assigned to one generator and can be operated with the latter as an independent sputtering source.

When it becomes necessary to switch to conventional sputtering, the master-slave configuration is given up. At least one generator is then assigned to each sputtering source. The corresponding configuration is represented in FIG. 3. If there are more generators than sputtering sources, the surplus generators can be connected as slave to generators that have already been assigned to sputtering sources.

If fewer generators are available than there are sputtering sources, the excess sputtering sources can either be left idle or a power break can be imposed sequentially and periodically to the different sputtering sources so that they free up one generator for the duration of the power break.

Figure 1:
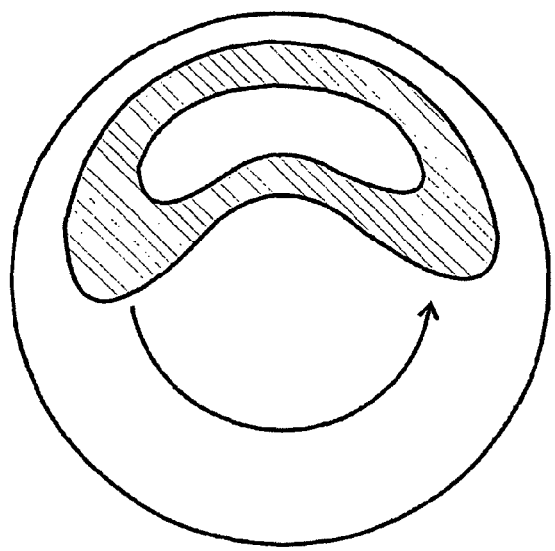
FIG. 1 shows the surface of a target together with the moving racetrack as it is used in conventional sputtering according to the state of the art.
Figure 4:
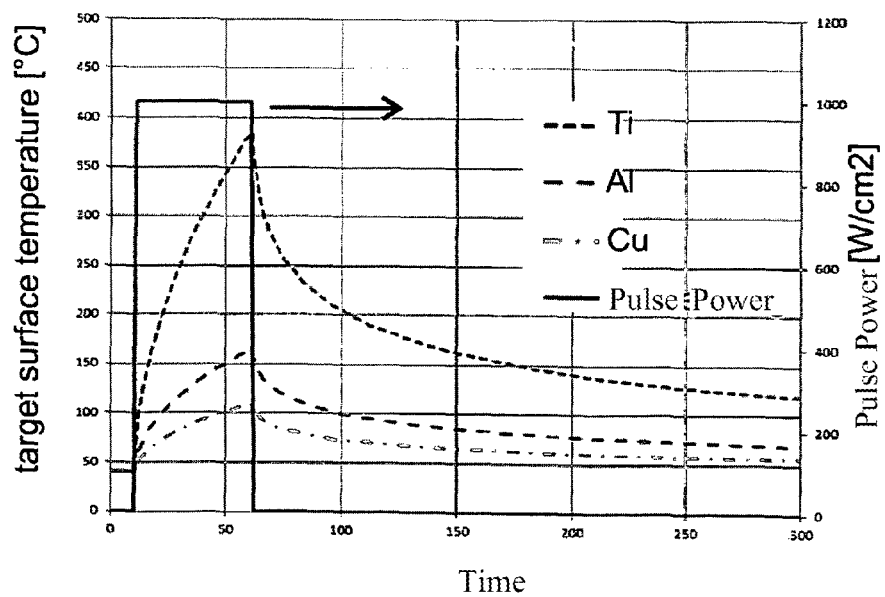
FIG. 4 shows the simulated cooling behavior of various target materials after a 50 ms long exposure to a power impulse.

In the concrete example, 2 DC generators AE Pinacle with 20 kW each were connected in a master-slave configuration. A maximum sputtering power of 40 kW was thus available. A circular magnetron of the type represented in FIG. 1 with a target diameter of 150 mm was used. A time-adjustable impulse of 40 kW sputtering power was switched onto the target. For a target of this size, the thermal limit is reached when it is fed on average with approx. 5 kW. A calculation of the evolution in time of the surface temperature depending on the target material is represented in FIG. 4. For an impulse power of 40 kW when using the magnetron described above, a power density of 600 W/cm$^2$ relative to the racetrack surface is to be expected. With a discharge voltage of 600V, a current density of 1.67 A/cm$^2$ is thus achieved. As shown by the Finite Element Simulation of FIG. 4, for a sputtering power density of 1000 W/cm$^2$ and an impulse duration of 50 ms, a temperature increase of only approx. 50° C. to 100° C. for copper or aluminum as well as of approx. 350° C. for titan is to be expected. The simulation suggests that a melting of the surface and evaporation of the latter, as is often mentioned, can be excluded.

After the impulse duration of 50 ms, the entire power is fed onto a further circular magnetron of similar construction. In the structure according to the present example, the vacuum chamber 6 comprises circular magnetrons of identical construction that are switched on each in succession. After a time interval of 300 ms, the first circular magnetron is again switched on. The circular magnetrons can be arranged in the vacuum chamber in a circle around a turntable on which the substrates to be coated are placed. The switching on of the individual circular magnetrons can occur in an anti-clockwise fashion, which simulates a faster rotation of the turntable.

The magnet system behind the target surface rotates with a frequency of 180 RPM. This means that for an impulse repetition that takes place every 300 ms, both frequencies do not form any rational ratio.

With the inventive configuration, a strong increase of the discharge current is achieved within the shortest time, for example 500 µs, and it remains at a stable level during the entire impulse duration. Disadvantageous transient processes that typically occur in HIPIMS processes due to the pulsing at high frequency are avoided with the inventive method. This is because in the inventive method, the impulse duration is several milliseconds and the transient processes become negligible.

Figure 5:
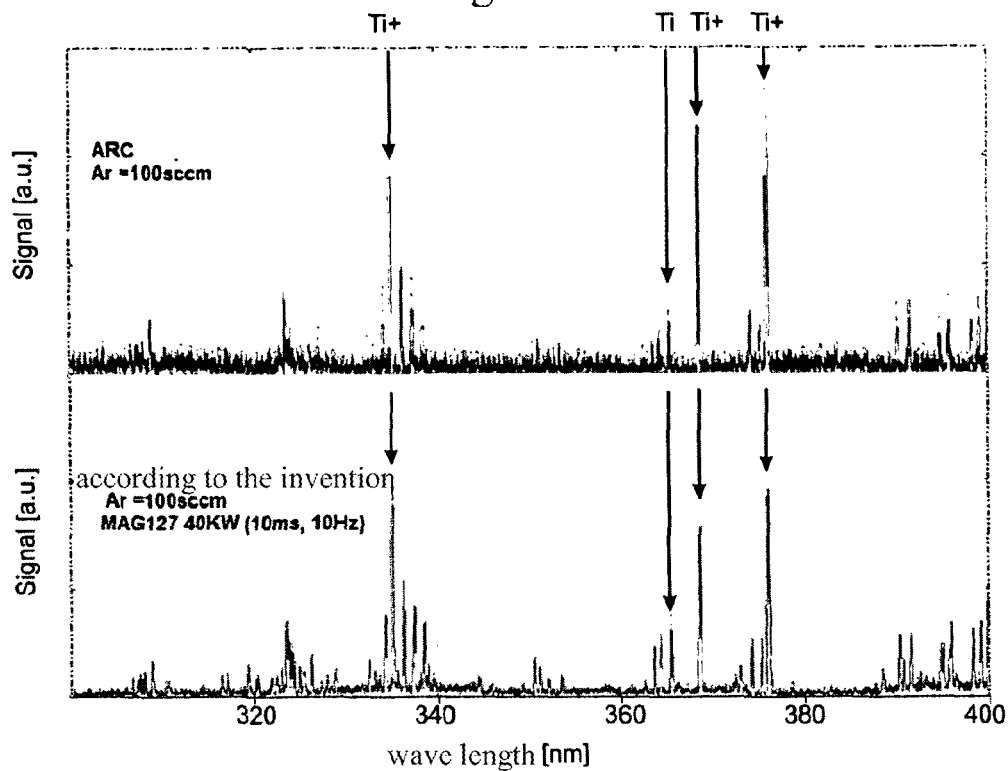
FIG. 5 shows spectroscopic measurements on an arc discharge by comparison with such measurements on the inventive plasma discharge.

According to a second embodiment of the inventive method, an impulse power of 40 kW and impulse duration of 10 ms at a repetition frequency of 10 Hz were applied to the system described above. This resulted in an average power of 4 kW per circular magnetron. Up to 10 circular magnetrons can be integrated into the vacuum chamber and be fed all with the above-mentioned master-slave configuration. The plasma of the discharge was assessed spectroscopically and compared with the plasma of an arc evaporation. In the example, the target was a titanium target. FIG. 5 shows both spectra in comparison, wherein these are each standardized to the Ti(0) line at 365.35 nm in terms of their intensity. Both discharges show strong optical emissions for Ti+ at 336.12 nm, 368.52 nm and at the double line, unseparated in the figure, with 375.93 nm and 376.132 m. This allows the conclusion that the inventive sputtering method results in a high ionization of the material removed from the target that is comparable with that of arc evaporation.

Figure 6:
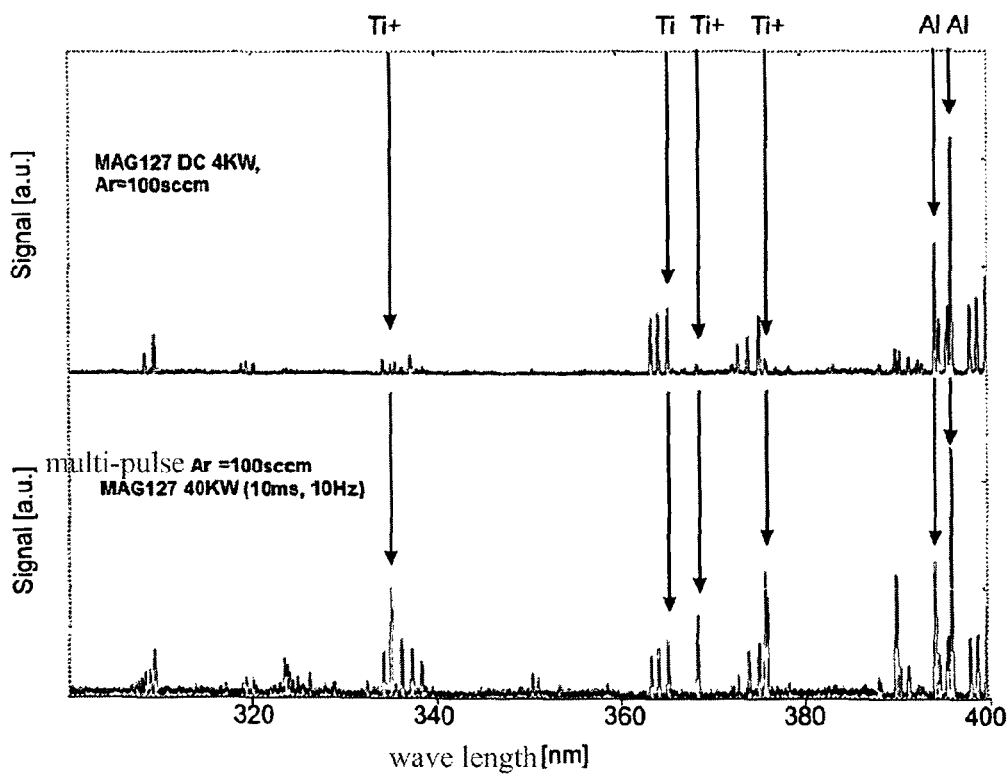
FIG. 6 shows spectroscopic measurements on the discharge of a conventional DC sputtering plasma by comparison with such measurements on the inventive plasma discharge.

According to a third example, a titan-aluminum was used as target material in a ratio of 50 at % Ti and 50 at % Al. In order to compare the inventive method with the conventional sputter technique, the plasma of the conventional sputter coating and the plasma of the inventive method were recorded spectroscopically and compared to one another. For the conventional sputter coating, the configuration as shown in FIG. 3 was used. However, since only 2 DC generators were available for the experiment, a sputtering source was each fed with one generator, i.e. two sputtering sources were fed simultaneously and after the prescribed time interval, the power was redirected to two other sputtering sources in succession. The corresponding comparison is shown in FIG. 6. In both cases, the average sputtering power was 4 kW. The spectra were standardized to the Al(0) lines 394.4 nm and 396.15 nm. It is apparent that in the case of the conventional DC discharge, the lines for ions such as Al+ at 390.07 nm, Ti+ at the double line 375.93 nm and 376.132 nm as well as at 368.52 nm and 336.12 nm are to a large extent absent. This also supports the conclusion that with the inventive method, there is a high degree of ionization of the material removed from the target.

According to a further embodiment of the present invention, the method is conceived as a dual magnetron process. In this respect, the sputtering power alternates during one impulse that persists for several microseconds between at least two sputtering magnetrons with an alternating frequency of typically between 20-60 kHz, wherein the target surface each time alternatingly becomes the cathode or the anode. In order not to exceed the thermal load of the target, the applied power on the magnetron pairs is respectively limited in time by switching to a further pair of magnetrons after the impulse.

All examples have been discussed on the basis of circular cathodes. The one skilled in the art will however immediately understand that the same inventive concept can be transferred in a simple manner to rectangular cathodes. A particular advantage of the present invention lies in the fact that a simple DC generator can be used whose overall output of e.g. 40 kW can be introduced in the coating chamber, whilst due to the inventive interconnection of the generator with the individual sputtering sources simultaneously a degree of ionization can be achieved that would be achievable in the frame of a sputtering process typically only with highly complex impulse generators. In preferred embodiments of the present invention, a moving magnetic field system is respectively provided behind the sputtering targets and ensures the racetrack moves over the target.

The inventive method and the inventive apparatus make it possible to change in a simple manner from the inventive sputtering that results in a high ion concentration to conventional sputtering with a low ion concentration.

In the frame of the present description, a method has been disclosed for generating a plasma discharge with a discharge current density that is in at least some areas locally greater than $0.2$ A/cm$^2$, with the steps of:
   providing a power supply unit with a predefined maximum output
   providing at least two magnetron sputtering sources with a predefined racetrack each and predefined thermal limit, wherein the racetrack is designed so small that when the maximum output of the power supply unit is applied on one each of the magnetron sputtering sources, the discharge current density is greater than $0.2$ A/cm$^2$;
   by means of the power supply unit, feeding a first output in a first of the at least two magnetron sputtering sources for a first time interval, wherein the first output is chosen sufficiently high so that a discharge current density greater than $0.2$ A/cm$^2$ is generated at least in one area locally and wherein the first time interval is chosen sufficiently small so that the predefined thermal limit of the first magnetron sputtering source is not exceeded;
   by means of the power supply unit, feeding a second output in a second of the magnetron sputtering sources for a second time interval, wherein the second output is chosen high enough so that so that a discharge current density greater than $0.2$ A/cm$^2$ is generated at least in one area locally and wherein the second time interval is chosen sufficiently small so that the predefined thermal limit of the second magnetron sputtering source is not exceeded;
characterized in that the power supply unit comprises at least two generators that are connected to one another in a master-slave configuration and in that the two time intervals do not completely overlap.

A third and preferably further magnetron sputter sources can be provided with a predefined racetrack each and predefined thermal limit each, wherein the racetracks are designed in such a way that when the maximum output of the power supply unit is applied respectively to one of the magnetron sputtering sources, the discharge current density is greater than $0.2$ A/cm$^2$ and the power supply unit has at least as many slave generators that the number of the slave generators and the master generator yield a number of generators that is equal to or greater than the number of the magnetron sputtering sources.

The time intervals can be composed of periodically recurring intervals and thus form periodic impulses.

Behind at least one of the targets of the magnetron sputtering sources, a moving, preferably rotating magnet system can be provided that results in a moving racetrack whose propagation is considerably smaller than the target surface, yet greater than 20% of the target surface.

A magnetron sputtering facility with two or more magnetron sputtering sources and one power supply unit has been disclosed, wherein the power supply unit comprises a number of generators that corresponds to at least the number of the magnetron sputtering sources and means are provided that, on the one hand, allow the generators available in the power supply unit to be configured with one master and at least one slave and a switch is provided with which the output of the power supply unit thus configured can be applied in succession to the magnetron sputtering sources and the means, on the other hand, enable the power supply unit to be configured as a number of isolated generators and by means of the switch the power of at least one generator respectively can be brought onto one magnetron sputtering source respectively.

What is claimed is:

1. A method for generating a plasma discharge with a discharge current density that is in at least some areas locally greater than 0.2 A/cm$^2$, comprising steps of:
   providing a power supply unit with a predefined maximum output;
   providing each of at least two magnetron sputtering sources with a predefined racetrack and a predefined thermal limit, wherein the racetracks are designed so small that when the maximum output of the power supply unit is applied on each of the at least two magnetron sputtering sources, the discharge current density is greater than 0.2 A/cm$^2$;
   via the power supply unit, feeding a first output in a first of the at least two magnetron sputtering sources for a first time interval, wherein the first output is chosen sufficiently high so that a discharge current density greater than 0.2 A/cm$^2$ is generated at least in one area locally and wherein the first time interval is chosen sufficiently small so that the predefined thermal limit of the first magnetron sputtering source is not exceeded;
   via the power supply unit, feeding a second output in a second of the at least two magnetron sputtering sources for a second time interval, wherein the second output is chosen high enough so that a discharge current density greater than 0.2 A/cm$^2$ is generated at least in one area locally and wherein the second time interval is chosen sufficiently small so that the predefined thermal limit of the second magnetron sputtering source is not exceeded;
   wherein the power supply unit comprises at least two generators that are connected to one another in a master-slave configuration and in that the first and the second time intervals do not completely overlap.

2. The method according to claim 1, characterized in that a third magnetron sputter source is provided with a predefined racetrack and a predefined thermal limit, wherein the racetracks are designed in such a way that when the maximum output of the power supply unit is applied respectively to one of the magnetron sputtering sources, the discharge current density is greater than 0.2 A/cm$^2$, and the power supply unit has at least as many slave generators so that the number of the slave generators and the master generator yield a number of generators that is equal to or greater than the number of the magnetron sputtering sources.

3. The method according to claim 1, characterized in that the first and the second time intervals are composed of periodically recurring intervals and thus form periodic impulses.

4. The method according to claim 1, characterized in that behind at least one target of the magnetron sputtering sources, a moving magnet system is provided that results in a moving racetrack whose propagation is smaller than the target surface, yet greater than 20% of the target surface.

5. A magnetron sputtering facility with two or more magnetron sputtering sources and one power supply unit, wherein the power supply unit comprises a number of generators that corresponds to at least the number of the magnetron sputtering sources and means are provided that, on the one hand, allow the generators available in the power supply unit to be configured in a master-slave configuration with one master generator and at least one slave generator and a switch is provided with which an output of the power supply unit thus configured can be applied in succession to the two or more magnetron sputtering sources and the means, on the other hand, enable the power supply unit to be reconfigured from the master-slave configuration to a number of isolated generators and by means of the switch, power of at least one generator respectively can be brought onto one magnetron sputtering source respectively.

6. The method according to claim 4 wherein the magnet system is rotating.

7. The method according to claim 1, wherein in the master-slave configuration, the at least two generators are connected electrically in parallel, and said at least two generators are selectively reconfigurable from said master-slave configuration to an isolated configuration in which outputs of the at least two generators are respectively connected to different ones of the at least two magnetron sputtering sources.

8. The magnetron sputtering facility of claim 5, wherein, in the master-slave configuration, the master generator and the slave generator are connected electrically in parallel.

* * * * *